(12) United States Patent
Tanguay et al.

(10) Patent No.: US 10,925,178 B2
(45) Date of Patent: Feb. 16, 2021

(54) AVIONIC SLIDING RACK

(71) Applicant: Bell Helicopter Textron Inc., Fort Worth, TX (US)

(72) Inventors: Julien Tanguay, Montreal (CA); Mark Tentinger, Fort Worth, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 21 days.

(21) Appl. No.: 16/374,967

(22) Filed: Apr. 4, 2019

(65) Prior Publication Data
US 2020/0323096 A1 Oct. 8, 2020

(51) Int. Cl.
*H05K 7/14* (2006.01)
*B64D 43/00* (2006.01)
*H05K 7/18* (2006.01)

(52) U.S. Cl.
CPC ........... *H05K 7/1412* (2013.01); *B64D 43/00* (2013.01); *H05K 7/18* (2013.01)

(58) Field of Classification Search
CPC ......... H05K 7/1412; H05K 7/18; B64D 43/00
USPC .................. 248/188.1, 219.4, 27.1
See application file for complete search history.

(56) References Cited

U.S. PATENT DOCUMENTS

| | | | |
|---|---|---|---|
| 3,143,981 A * | 8/1964 | Tassell | E04B 2/766 108/108 |
| 3,462,110 A * | 8/1969 | Cheslock | E04H 12/08 248/219.4 |
| 4,021,973 A * | 5/1977 | Hegg | A47G 5/00 52/36.6 |
| 4,163,537 A * | 8/1979 | Mourgue | A47B 17/003 108/156 |
| 5,192,145 A * | 3/1993 | Rixen | F16B 7/187 403/255 |
| 5,481,842 A * | 1/1996 | Gautreau | E04B 2/76 52/656.9 |
| 5,979,119 A * | 11/1999 | Trafton | E04B 1/2403 52/40 |
| 6,712,543 B1 * | 3/2004 | Schmalzhofer | F16B 7/187 403/381 |
| 7,032,862 B2 * | 4/2006 | Landes | B64D 43/00 244/129.1 |
| 7,178,765 B2 * | 2/2007 | Huang | A47B 21/00 248/122.1 |
| 7,389,621 B2 * | 6/2008 | Hawes | E04C 3/005 52/647 |

(Continued)

FOREIGN PATENT DOCUMENTS

CN 207438123 U 6/2018

OTHER PUBLICATIONS

Radiorax, "Radiorax 2009 Catalog, The avionics mounting standard," URL:<http://www.radiorax.com/documents/catalog.php?document-radiorax_catalog&name=Radiorax%20Kit%20Catalog>, Retrieved: Apr. 3, 2019.

*Primary Examiner* — Muhammad Ijaz
(74) *Attorney, Agent, or Firm* — Shackelford, Bowen, McKinley & Norton, LLP

(57) ABSTRACT

An example of a mounting rail system for a console of an aircraft includes a mounting rail with a track that includes two bevelled faces, a pyramidal nut configured to fit within the track, and a mounting bracket configured to be secured to the mounting rail via a fastener that attaches to the pyramidal nut. The pyramidal nut includes two bevelled faces that align with the two bevelled faces of the track.

20 Claims, 6 Drawing Sheets

(56) References Cited

U.S. PATENT DOCUMENTS

| | | | |
|---|---|---|---|
| 7,600,349 B2 * | 10/2009 | Liebendorfer | F24S 25/61 52/173.3 |
| 7,748,175 B2 | 7/2010 | Liebendorfer | |
| 7,784,738 B1 | 8/2010 | Landes et al. | |
| 8,132,772 B1 * | 3/2012 | Thomas | F16C 29/004 248/500 |
| 8,640,400 B2 | 2/2014 | Liebendorfer | |
| 8,695,290 B1 * | 4/2014 | Kim | F24S 25/67 52/173.3 |
| 9,022,712 B2 * | 5/2015 | Klopfenstein, II | F16B 5/0685 411/549 |
| 9,212,675 B2 * | 12/2015 | Oetlinger | F16B 7/187 |
| 9,584,062 B2 * | 2/2017 | Ganshaw | H02S 30/10 |
| 9,732,780 B2 * | 8/2017 | Anderson | B60M 1/20 |
| 10,433,450 B2 * | 10/2019 | Kinard | F16B 5/123 |
| 2003/0183730 A1 * | 10/2003 | Landes | B64D 43/00 248/27.1 |
| 2010/0294906 A1 * | 11/2010 | Klepack | B65G 21/06 248/231.9 |
| 2011/0000526 A1 * | 1/2011 | West | F16B 5/0216 136/251 |
| 2011/0215203 A1 * | 9/2011 | Rose | H05K 7/1412 244/131 |
| 2012/0175479 A1 * | 7/2012 | Graham | B60M 1/20 248/291.1 |

* cited by examiner

AVIONIC SLIDING RACK

BACKGROUND

This section provides background information to facilitate a better understanding of the various aspects of the disclosure. It should be understood that the statements in this section of this document are to be read in this light, and not as admissions of prior art.

Modern aircraft incorporate various avionics equipment for use by a pilot and co-pilot. Avionics equipment includes equipment such as radios, navigational equipment, control systems, and the like. The avionics equipment are typically mounted to a dash or console of the aircraft and are positioned to be accessible by the pilot and/or co-pilot. Depending on the purpose of a particular aircraft, different avionics equipment may be desired. To allow for different avionics equipment to be easily fitted to an aircraft, the console typically includes a plurality of mounting holes spaced along a length of the console. While the spaced mounting holes offer some placement flexibility, the pre-set bolt holes can prevent the avionics equipment from being mounted as precisely as may be desired. To overcome the limitations associated with pre-set mounting holes, a mounting rail system can be used.

SUMMARY

An example of a mounting rail system for a console of an aircraft includes a mounting rail with a track that includes two bevelled faces, a pyramidal nut configured to fit within the track, and a mounting bracket configured to be secured to the mounting rail via a fastener that attaches to the pyramidal nut. The pyramidal nut includes two bevelled faces that align with the two bevelled faces of the track.

An example of a mounting rail system for a console of an aircraft includes a mounting rail with a track that includes two bevelled faces, a pyramidal nut configured to fit within the track, a mounting bracket configured to be secured to the mounting rail via a fastener that attaches to the pyramidal nut, and a spacer disposed between the mounting bracket and the mounting rail. The pyramidal nut includes two bevelled faces that align with the two bevelled faces of the track.

This summary is provided to introduce a selection of concepts that are further described below in the detailed description. This summary is not intended to identify key or essential features of the claimed subject matter, nor is it intended to be used as an aid in limiting the scope of claimed subject matter.

BRIEF DESCRIPTION OF THE DRAWINGS

The disclosure is best understood from the following detailed description when read with the accompanying figures. It is emphasized that, in accordance with standard practice in the industry, various features are not drawn to scale. In fact, the dimensions of various features may be arbitrarily increased or reduced for clarity of discussion.

DETAILED DESCRIPTION

Figure 1:
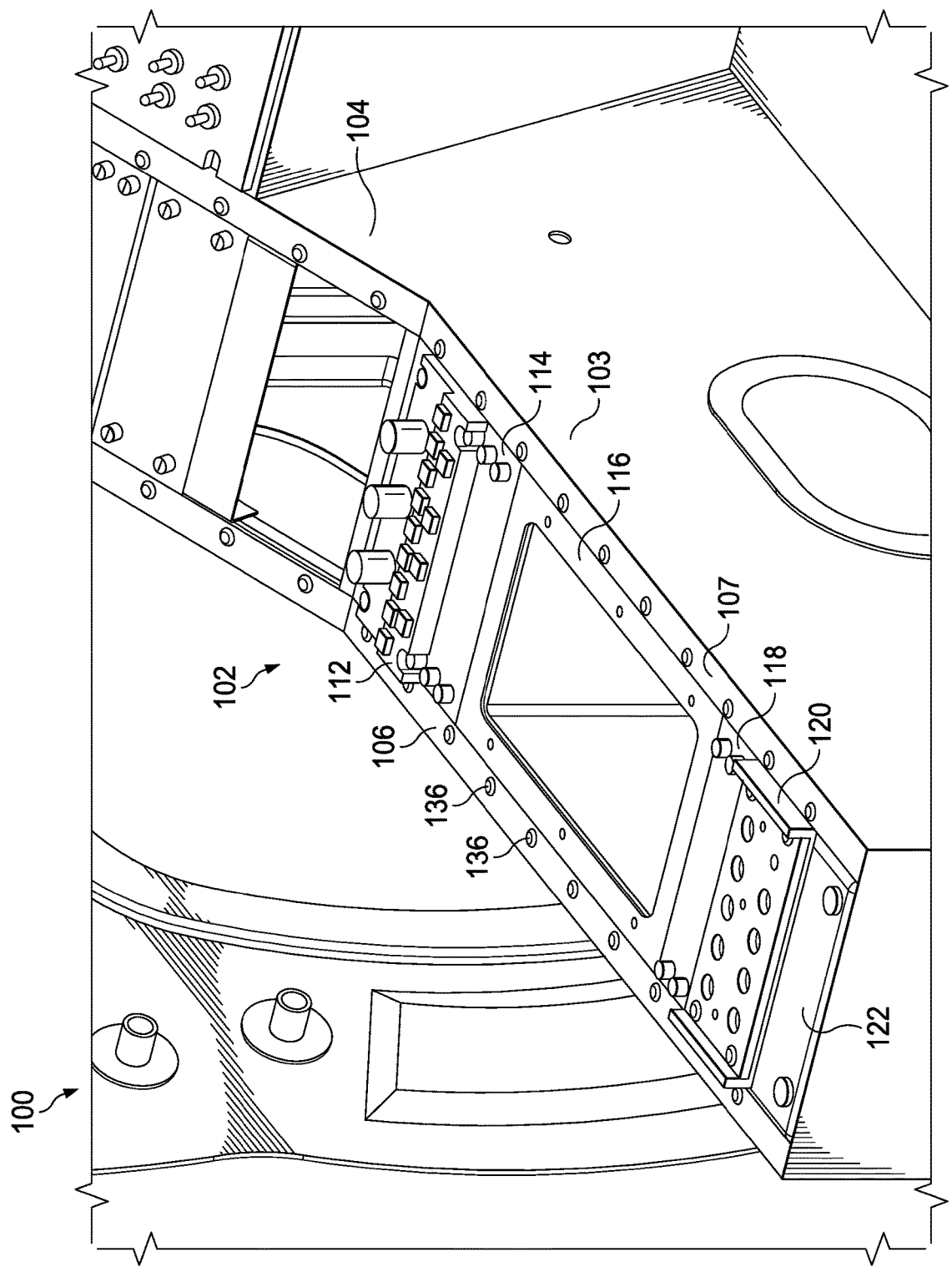
FIG. 1 is a partial view of an illustrative cockpit of an aircraft according to aspects of the disclosure.

It is to be understood that the following disclosure provides many different embodiments, or examples, for implementing different features of various embodiments. Specific examples of components and arrangements are described below to simplify the disclosure. These are, of course, merely examples and are not intended to be limiting. In addition, the disclosure may repeat reference numerals and/or letters in the various examples. This repetition is for the purpose of simplicity and clarity and does not in itself dictate a relationship between the various embodiments and/or configurations discussed.

In the specification, reference may be made to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

FIG. 1 is a partial view of an illustrative cockpit 100 of an aircraft according to aspects of the disclosure. Cockpit 100 includes a pedestal or console 102 to which various avionics equipment may be secured. Console 102 includes an upper portion 103 and a lower portion 104. Each of the upper and lower portions 103, 104 include openings to receive the avionics equipment and flanges 106, 107 positioned on opposite sides of the openings. Each flange 106, 107 includes a plurality of bolt holes 108 to facilitate mounting of the avionics equipment. Typically, each bolt hole 108 of the plurality of bolt holes 108 are spaced apart at regular intervals (e.g., every ⅜ of an inch). While the plurality of bolt holes 108 offer a variety of mounting options, it is often preferable to have even greater flexibility regarding the exact placement of avionics equipment. To provide that flexibility, a mounting rail system 110 (best seen in FIGS. 2 and 3A-3C) with sliding mounting points can be used with console 102. For illustrative purposes, FIG. 1 shows various components secured to lower portion 104 via mounting rail system 110, including: a first avionics device 112, a blanking plate 114, a spacer 116, a blanking plate 118, a plate 120, and a second avionics device 122.

Figure 2:
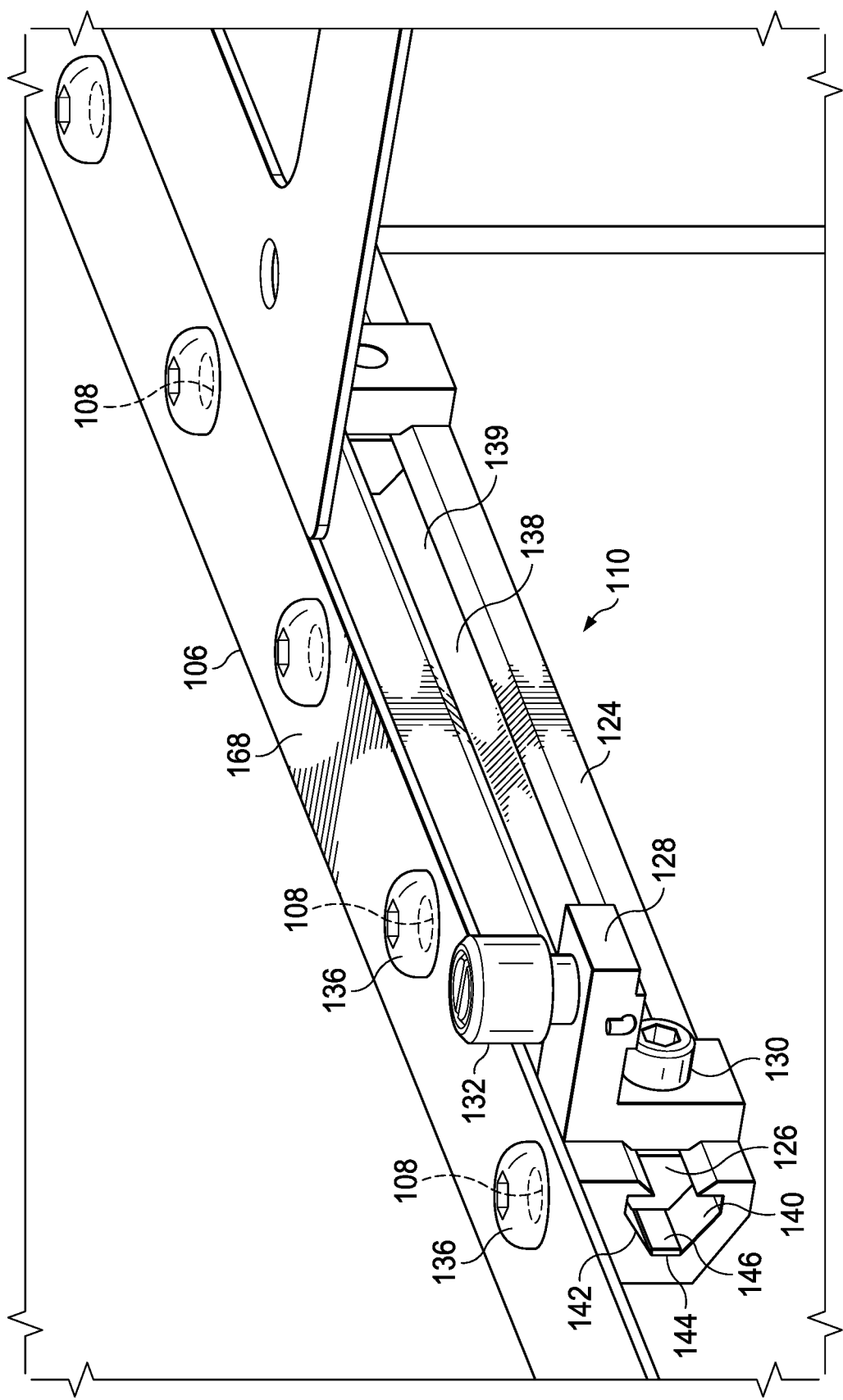
FIG. 2 is a close-up view of a railing system for an aircraft according to aspects of the disclosure.
Figure 3A:
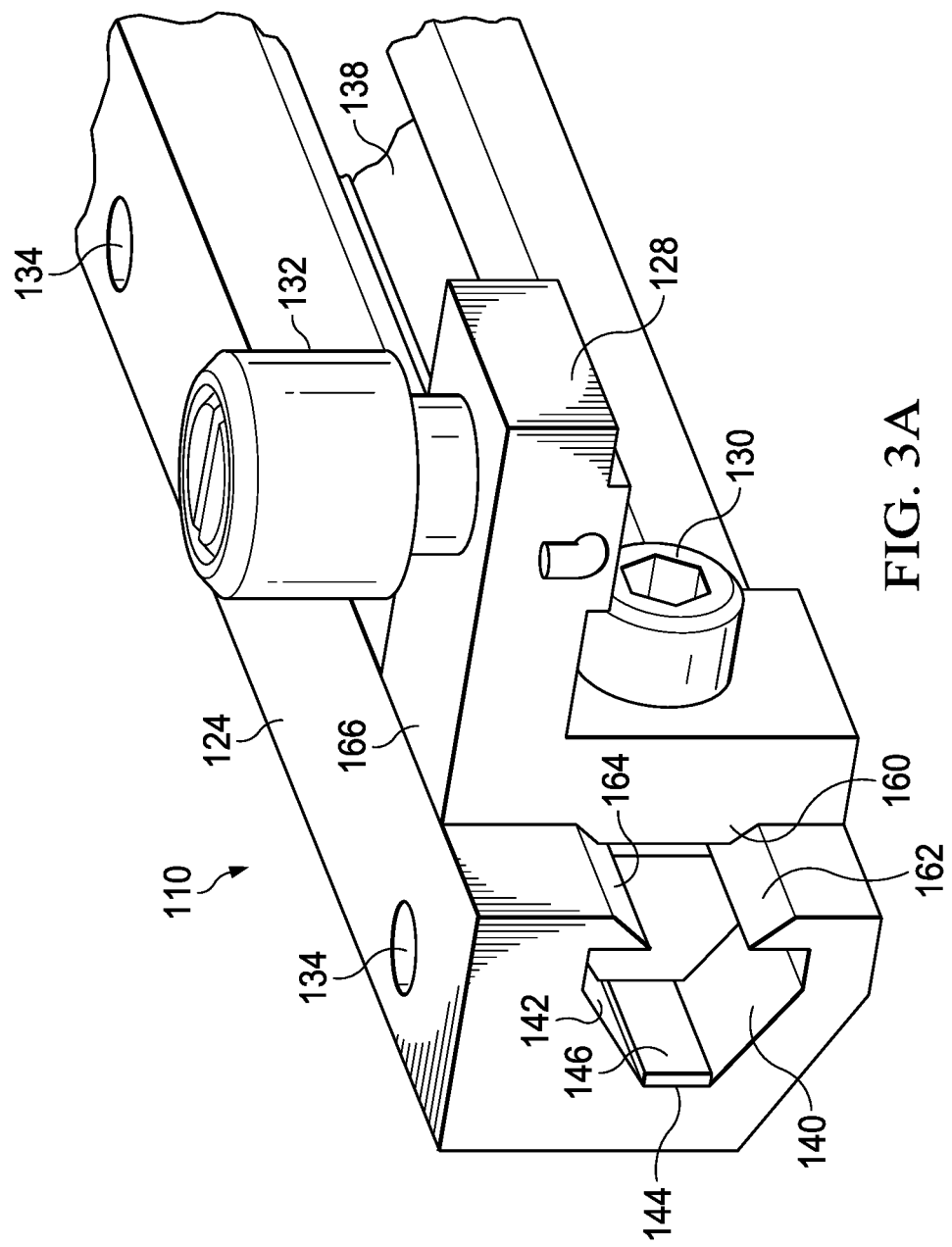
FIGS. 3A-3C are close-up views of the railing system of FIG. 2 according to aspects of the disclosure.
Figure 3B:
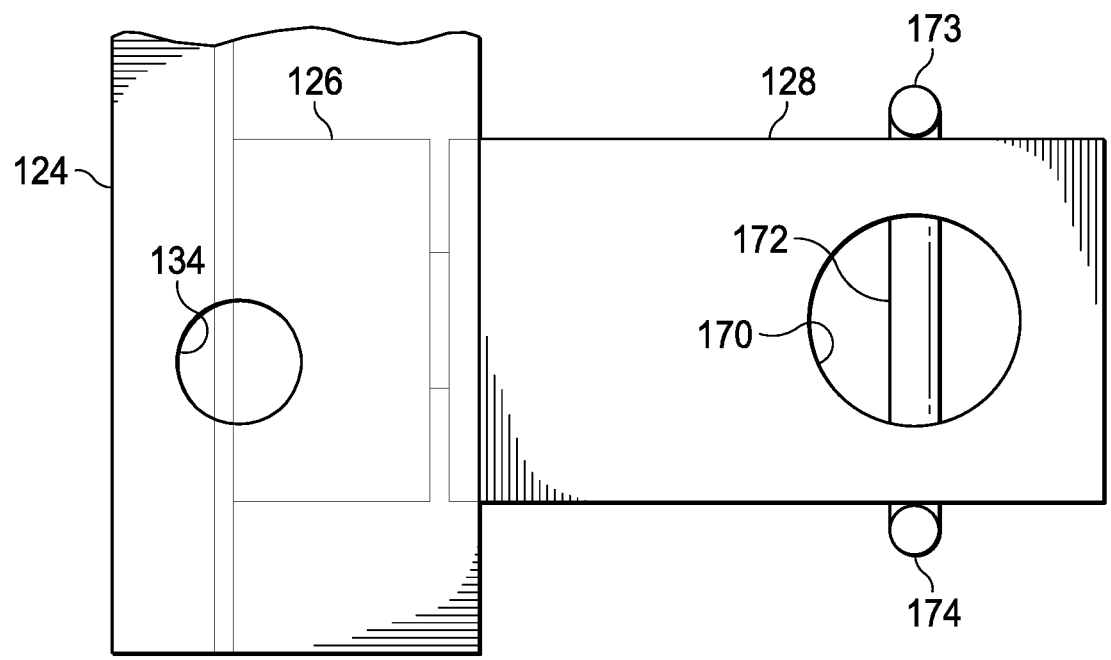
Figure 3C:
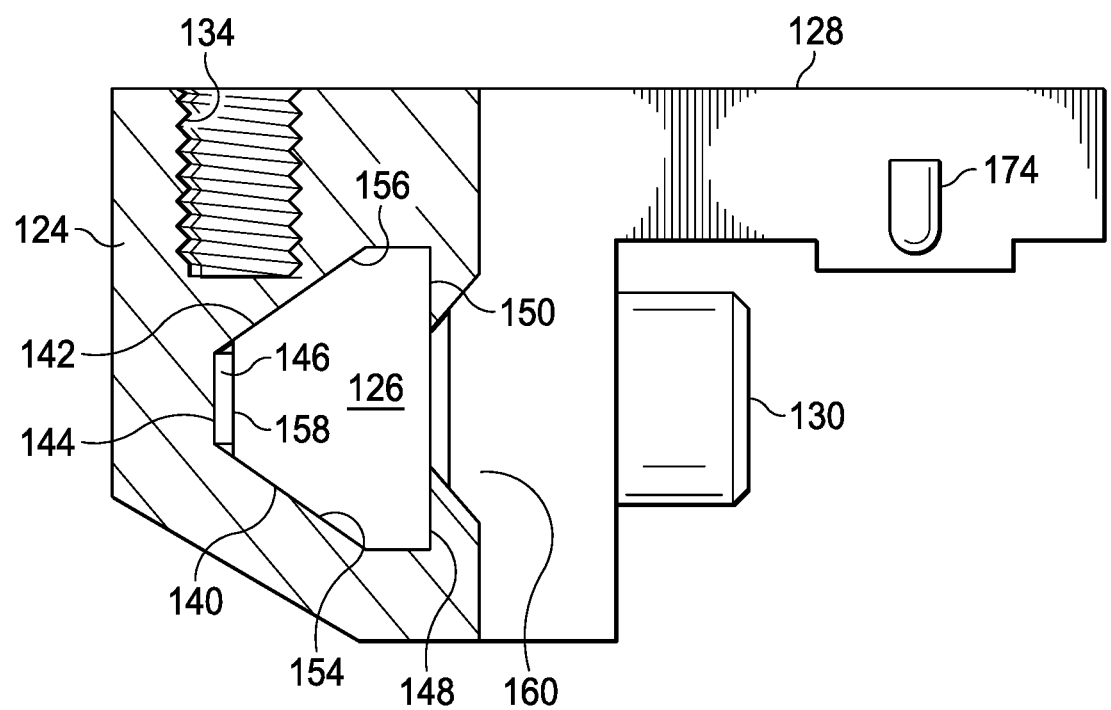

Referring now to FIGS. 2 and 3A-3C, close-up views of mounting rail system 110 attached to flange 106 are illustrated according to aspects of the disclosure. In FIG. 2, components 120 and 122 are hidden for illustrative purposes. FIGS. 3A-3C are perspective, top, and side views, respectively, of mounting rail system 110. In FIGS. 3A-3C, flange 106 is hidden for illustrative purposes. In FIGS. 3B and 3C, mounting rail 124 has been made transparent to better illustrate an interior of mounting rail 124. Mounting rail system 110 includes a first set of components that attach to flange 106 and a second set of components that attach to flange 107. The second set of components is a mirror of the first set of components. The first set of components will be discussed with the understanding that the discussion thereof also applies to the second set of components. The first set of components includes a mounting rail 124, a pyramidal nut 126, a mounting bracket 128, a fastener 130, and a fastener 132.

Mounting rail 124 includes a plurality of bolt holes 134 (best seen in FIG. 3A) positioned along a length of mounting rail 124 that coincide with the plurality of bolt holes 108. Mounting rail 124 is secured to flange 106 via fasteners 136 and includes a track 138 that is configured to receive pyramidal nut 126. Track 138 includes bevelled faces 140, 142 and a face 144. Face 144 is positioned between bevelled faces 140, 142 and faces an opening 139 of track 138.

Mounting rail 124 also includes a biasing means 146 that is positioned on face 144 and configured to be in biasing contact with a face 158 of pyramidal nut 126 (best seen in FIG. 3C). Biasing contact is used herein to mean that biasing means 146 has some elasticity or spring such that biasing means 146 presses upon pyramidal nut 126 to bias pyramidal nut 126 into contact with faces 148, 150 of track 138. Pyramidal nut 126 is inserted into track 138 from the side. In some aspects, it may be desirable to pre-install a plurality of pyramidal nuts 126 into mounting rail 124. This ensures that a sufficient amount of pyramidal nuts 126 are always available in the event that additional and/or different components are installed into console 102. Using biasing means 146 to bias pyramidal nut 126 into contact with faces 148, 150 stabilizes any unused pyramidal nuts 126 within track 138 to prevent unwanted movement of pyramidal nut 126 within track 138 while still allowing pyramidal nut 126 to be positioned as desired for installation of various components. FIG. 3C illustrates biasing means 146 pressing against face 158. Without biasing means 146, unused pyramidal nuts 126 would slide and/or rattle within mounting rail 124.

Biasing means 146 can be made of a variety of materials. In some aspects, biasing means 146 is made of material that that is elastically compressible. In some aspects, biasing means 146 acts like a spring. Biasing means 146 can be made from, for example, various polymeric material, rubber materials, silicon gels, and/or cork. Polymeric materials include elastomers. An elastomer is a polymer with viscoelasticity (i.e., both viscosity and elasticity) and very weak intermolecular forces, and generally low Young's modulus and high failure strain compared with other materials. Exemplary polymers include natural polyisoprene (e.g., cis-1,4-polyisoprene natural rubber (NR) and trans-1, 4-polyisoprene gutta-percha), synthetic polyisoprene (e.g., isoprene rubber), polybutadiene (e.g., butadiene rubber), chloroprene rubber (e.g., polychloroprene, Neoprene, Baypren), butyl rubber (e.g., copolymer of isobutylene and isoprene, IIR), halogenated butyl rubbers (e.g., chloro butyl rubber and bromo butyl rubber), styrene-butadiene rubber (e.g., copolymer of styrene and butadiene) nitrile rubber (e.g., copolymer of butadiene and acrylonitrile), hydrogenated nitrile rubbers (e.g., Therban and Zetpol), ethylene propylene rubber, ethylene propylene diene rubber, epichlorohydrin rubber, polyacrylic rubber, silicone rubber, fluorosilicone rubber, fluoroelastomers, viton, tecnoflon, fluorel, aflas and dai-el, perfluoroelastomers, tecnoflon, PFR, kalrez, chemraz, perlast, polyether block amides, chlorosulfonated polyethylene, hypalon, ethylene-vinyl acetate, and thermoplastic elastomers, polysulfide rubber, and elastolefin.

In some aspects, biasing means 146 can comprise a metal strip that is slightly compressible. For example, sheets of thin steel can be layered to have a spring-like action (similar to materials used for multi-layered metal gaskets). In other aspects a piece of bent/arced sheet metal can be used as biasing means. For example, the sheet metal can include a single arc or a plurality of arcs or waves.

Pyramidal nut 126 is similar to a conventional nut used with a bolt, but includes bevelled faces 154, 156 and a face 158. Bevelled faces 154, 156 align with bevelled faces 140, 142 and face 158 faces biasing means 146. Bevelled faces 154, 156 align with bevelled faces 140, 142 to help keep pyramidal nut 126 aligned within track 138.

Mounting bracket 128 is secured to mounting rail 124 via fastener 130 and pyramidal nut 126. Mounting bracket 128 includes a raised portion 160 that is dimensioned to complement faces 162, 164 of opening 139 (best seen in FIG. 3A). Raised portion 160 ensures that a top face 166 of mounting bracket 128 is parallel with a top face 168 of flange 106. This parallel alignment ensures that avionics equipment mounted to console 102 is mounted at the correct angle within console 102. In some aspects, mounting bracket 128 is a dzus rail that includes a hole 170 with a mounting wire 172. A dzus rail is a part of a standardized, quick fastening system that works with quarter-turn fasteners, such as fastener 132, to allow for quick and secure coupling of components. Mounting wire 172 includes turned ends 173, 174 to help retain mounting wire 172 within mounting bracket 128. Fastener 132 is used to secure components to mounting rail system 110. For example, FIG. 1 illustrates components 112-122 so secured to console 102. FIGS. 3A-3C illustrate a single mounting bracket 128. It will be appreciated that multiple mounting brackets 128 can be fitted to mounting rail 124 as needed to secure various avionics equipment to console 102.

Figure 4A:
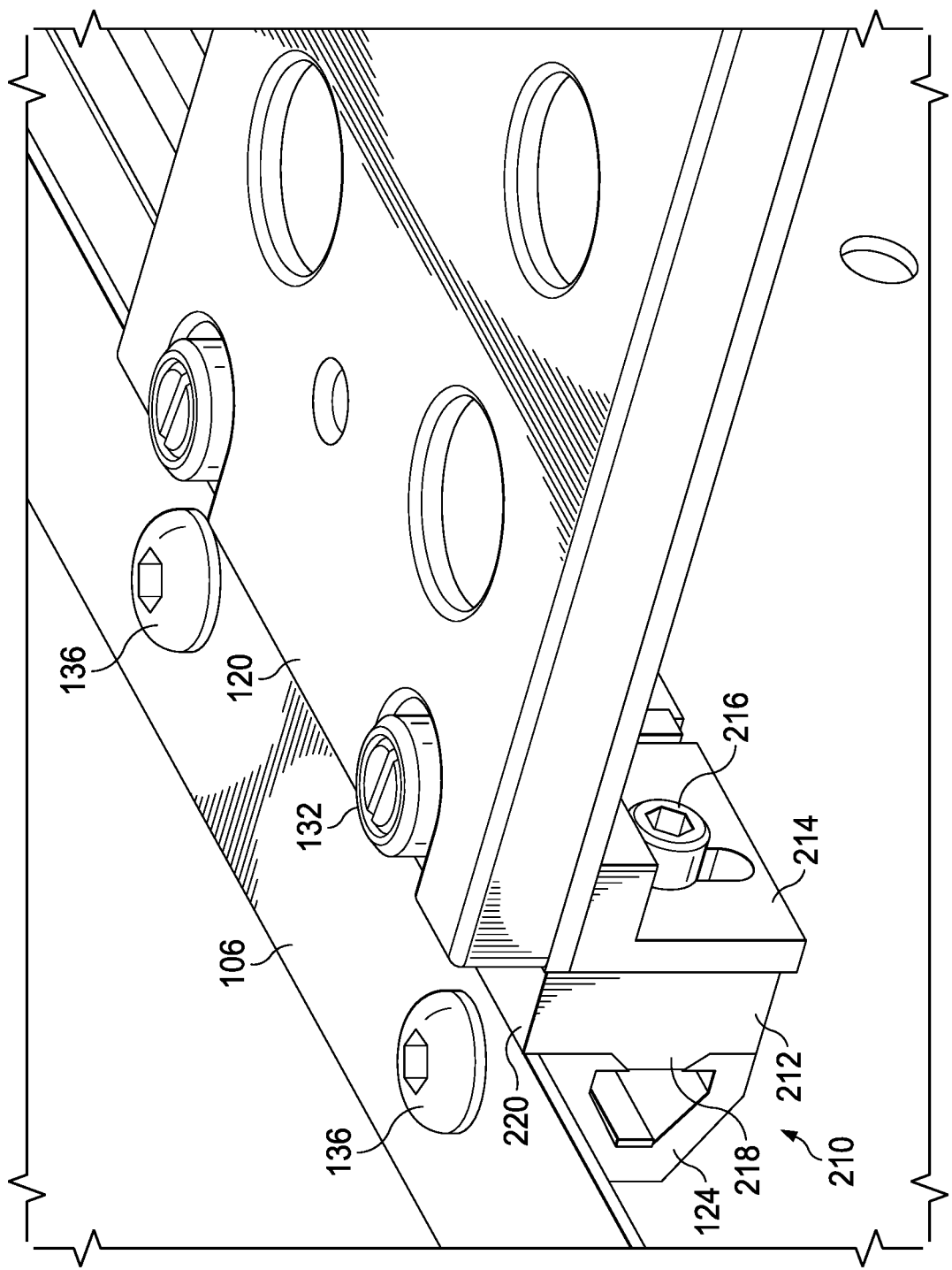
FIGS. 4A and 4B are close-up views of a railing system for an aircraft according to aspects of the disclosure.
Figure 4B:
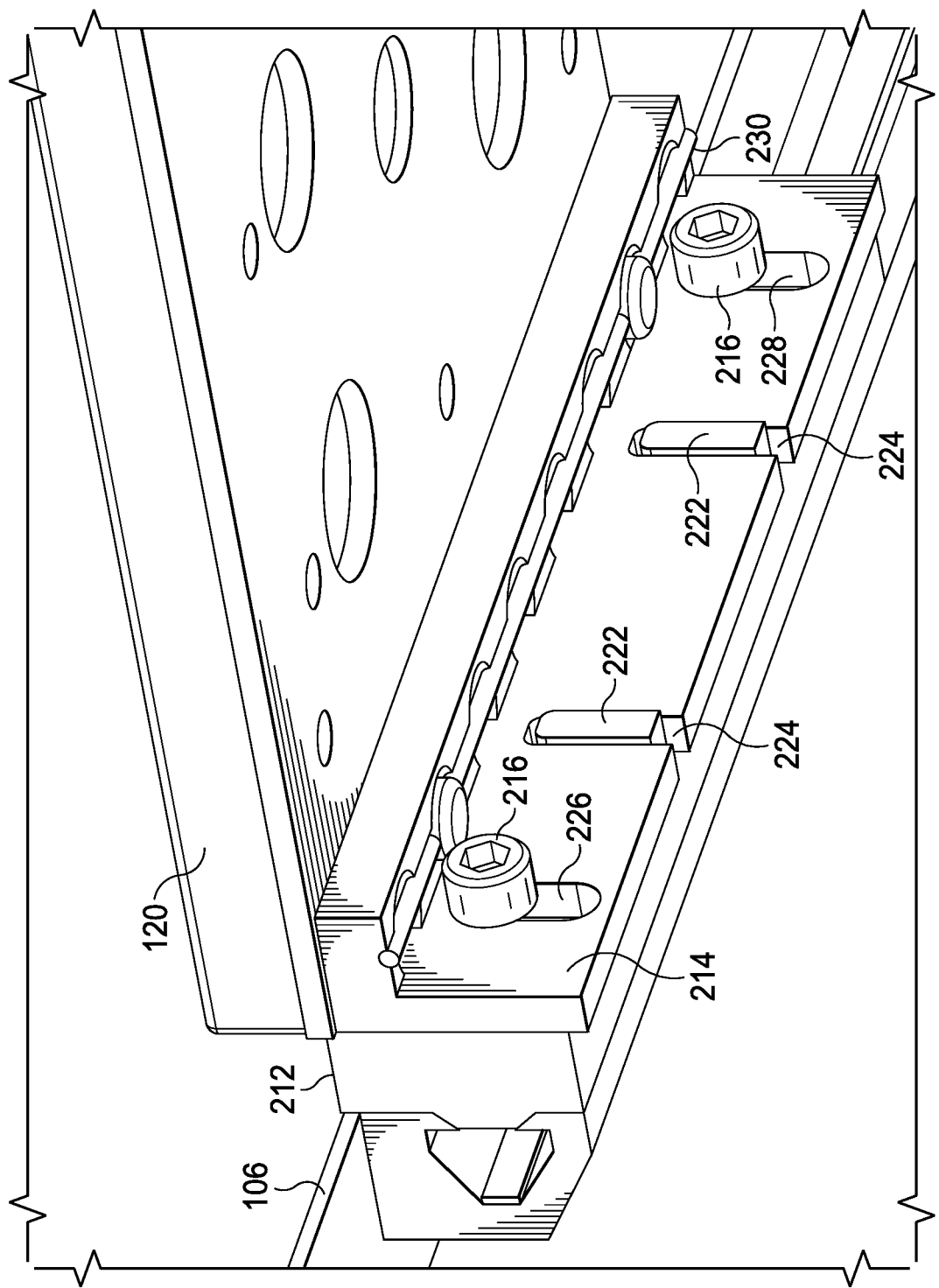

Referring now to FIGS. 4A and 4B, an adjustable mounting rail system 210 is illustrated according to aspects of the disclosure. Adjustable mounting rail system 210 differs from mounting rail system 110 in that adjustable mounting rail system 210 includes a spacer 212 that allows for narrower components to be fitted to console 102 and further allows for a height of the mounted components to be set as desired. Adjustable mounting rail system 210 includes mounting rail 124, pyramidal nut 126, spacer 212, a mounting bracket 214, a fastener 216, and fastener 132. Similar to the discussion of FIGS. 1, 2, and 3A-3C above, only one side of adjustable mounting rail system 210 will be discussed with the understanding that the discussion applies to the other side of adjustable mounting rail system 210.

With regard to adjustable mounting rail system 210, mounting rail 124 and pyramidal nut 126 function in much the same way as with mounting rail system 110. Spacer 212 comprises a raised portion 218 that is similar to raised portion 160 and is dimensioned to complement a faces 162, 164 of opening 139. Raised portion 218 similarly ensures that a top face 220 of spacer 212 is parallel with a top face 168 of flange 106. As illustrated in FIGS. 4A and 4B, spacer 212 comprises a length that matches component 120. In other aspects, spacers 212 having different lengths may be used. In various aspects, spacers 212 having different thickness may be used to ensure that the component being mounted is properly fitted to console 102.

As shown in FIG. 4B, spacer 212 includes tabs 222 that mate with corresponding slots 224 of mounting bracket 214. Tabs 222 help properly position mounting bracket 214 relative to spacer 212. Mounting bracket 214 includes a pair of slotted holes 226, 228 that receive fasteners 130. Slotted holes 226, 228 allow a height of mounting bracket 214 to be adjusted so that a height of the component being mounted to console 102 can be adjusted as desired. In some aspects, mounting bracket 214 is a dzus rail that includes a mounting wire 230 (similar to mounting wire 172) for receiving quarter-turn fasteners, such as fasteners 132. As shown in FIGS. 4A and 4B, multiple mounting brackets 214 are used in combination with mounting rail 124 to secure component 120 to console 102. In other aspects, more or fewer mounting brackets 214 can be used as desired.

The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," "generally," and "about" may be substituted with "within [a percentage] of" what is specified, as understood by a person of ordinary skill in the art. For example, within 1%, 2%, 3%, 5%, and 10% of what is specified herein.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions and alterations herein without departing from the spirit and scope of the disclosure. The scope of the invention should be determined only by the language of the claims that follow. The term "comprising" within the claims is intended to mean "including at least" such that the recited listing of elements in a claim are an open group. The terms "a," "an" and other singular terms are intended to include the plural forms thereof unless specifically excluded.

What is claimed is:

1. A mounting rail system for a console of an aircraft, the mounting rail system comprising:
    a mounting rail comprising:
        a plurality of holes configured to receive fasteners; and
        a track comprising two beveled faces, wherein the track opens substantially perpendicularly to the plurality of holes;
    a pyramidal nut configured to fit within the track and comprising two beveled faces that align with the two beveled faces of the track; and
    a mounting bracket configured to be secured to the mounting rail via a fastener that attaches to the pyramidal nut substantially perpendicularly to the plurality of holes.

2. The mounting rail system of claim 1, wherein the track further comprises a biasing means that bias the pyramidal nut against a portion of the mounting rail.

3. The mounting rail system of claim 2, wherein the biasing means is secured to a face between the two beveled faces of the track.

4. The mounting rail system of claim 2, wherein the biasing means comprises a polymeric material.

5. The mounting rail system of claim 2, wherein the biasing means comprises a rubber material.

6. The mounting rail system of claim 1, wherein the mounting bracket further comprises a rail configured to receive quarter-turn fasteners.

7. The mounting rail system of claim 6, wherein the rail has turned ends.

8. The mounting rail system of claim 1, wherein the mounting bracket has a raised portion that mates with an opening of the track to orient the mounting bracket such that a face of the mounting bracket is configured to be parallel with a face of the console.

9. The mounting rail system of claim 8, wherein the raised portion comprises faces that align with faces of the opening of the track.

10. The mounting rail system of claim 1, wherein the plurality of holes of the mounting rail are configured to align with a plurality of holes of a flange of the console.

11. The mounting rail system of claim 1, further comprising a spacer disposed between the mounting bracket and the mounting rail.

12. The mounting rail system of claim of 11, wherein the mounting bracket comprises a slotted hole to allow a height of the mounting bracket relative to the mounting rail to be adjusted.

13. The mounting rail system of claim 11, wherein the spacer comprises a tab that mates with a slot of the mounting bracket to align the mounting bracket relative to the spacer.

14. A mounting rail system for a console, the mounting rail system comprising:
    a mounting rail comprising:
        a plurality of holes configured to receive fasteners; and
        a track comprising two beveled faces, wherein the track opens substantially perpendicularly to the plurality of holes;
    a pyramidal nut configured to fit within the track and comprising two beveled faces that align with the two beveled faces of the track;
    a mounting bracket configured to be secured to the mounting rail via a fastener that attaches to the pyramidal nut substantially perpendicularly to the plurality of holes; and
    a spacer disposed between the mounting bracket and the mounting rail.

15. The mounting rail system of claim 14, wherein the track further comprises a biasing means that bias the pyramidal nut against a portion of the mounting rail.

16. The mounting rail system of claim 15, wherein the biasing means is secured to a face between the two beveled faces of the track.

17. The mounting rail system of claim 14, wherein the mounting bracket further comprises a rail configured to receive quarter-turn fasteners.

18. The mounting rail system of claim 17, wherein the rail has turned ends.

19. The mounting rail system of claim 14, wherein the mounting bracket has a raised portion that mates with an opening of the track to orient the mounting bracket such that a face of the mounting bracket is configured to be parallel with a face of the console.

20. The mounting rail system of claim of 14, wherein the mounting bracket comprises a slotted hole to allow a height of the mounting bracket relative to the mounting rail to be adjusted.

* * * * *